United States Patent
Norman

(10) Patent No.: US 8,111,572 B2
(45) Date of Patent: Feb. 7, 2012

(54) DISTURB CONTROL CIRCUITS AND METHODS TO CONTROL MEMORY DISTURBS AMONG MULTIPLE LAYERS OF MEMORY

(75) Inventor: Robert Norman, Pendleton, OR (US)

(73) Assignee: Unity Semiconductor Corporation

( * ) Notice: Subject to any disclaimer, the term of this patent is extended or adjusted under 35 U.S.C. 154(b) by 671 days.

(21) Appl. No.: 12/001,952

(22) Filed: Dec. 12, 2007

(65) Prior Publication Data

US 2009/0154232 A1    Jun. 18, 2009

(51) Int. Cl.
*G11C 7/02* (2006.01)
(52) U.S. Cl. .................. 365/209; 365/185.1; 365/191
(58) Field of Classification Search .................. 365/209, 365/185.1, 191
See application file for complete search history.

(56) References Cited

U.S. PATENT DOCUMENTS

| | | | |
|---|---|---|---|
| 6,005,810 A * | 12/1999 | Wu | 365/185.33 |
| 7,327,600 B2 | 2/2008 | Norman | |
| 7,372,753 B1 * | 5/2008 | Rinerson et al. | 365/209 |
| 2006/0171200 A1 * | 8/2006 | Rinerson et al. | 365/185.1 |
| 2008/0005459 A1 | 1/2008 | Norman | |
| 2008/0084727 A1 | 4/2008 | Norman | |

OTHER PUBLICATIONS

U.S. Appl. No. 12/001,335, filed Dec. 10, 2007, Robert Norman.
U.S. Appl. No. 11/975,275, filed Oct. 17, 2007, Robert Norman.
U.S. Appl. No. 11/893,647, filed Aug. 16, 2007, Robert Norman.
U.S. Appl. No. 11/893,644, filed Aug. 16, 2007, Robert Norman.
U.S. Appl. No. 11/999,376, filed Dec. 4, 2007, Robert Norman.
U.S. Appl. No. 11/655,599, filed Jan. 19, 2007, Robert Norman.
U.S. Appl. No. 11/449,105, filed Jun. 8, 2006, Robert Norman.

* cited by examiner

*Primary Examiner* — Jason Lappas

(57) ABSTRACT

Embodiments of the invention relate generally to data storage and computer memory, and more particularly, to systems, integrated circuits and methods for controlling memory disturbs to and among multiple layers of memory that include, for example, third dimensional memory technology. Each layer of memory can include a plurality of non-volatile memory cells that store data as a plurality of conductivity profiles that can be non-destructively read by applying a read voltage across a selected non-volatile memory cell. Data can be written to a selected non-volatile memory cell by applying a write voltage having a predetermined magnitude and polarity across the selected non-volatile memory cell. Stored data is retained in the plurality of non-volatile memory cells in the absence of power.

23 Claims, 10 Drawing Sheets

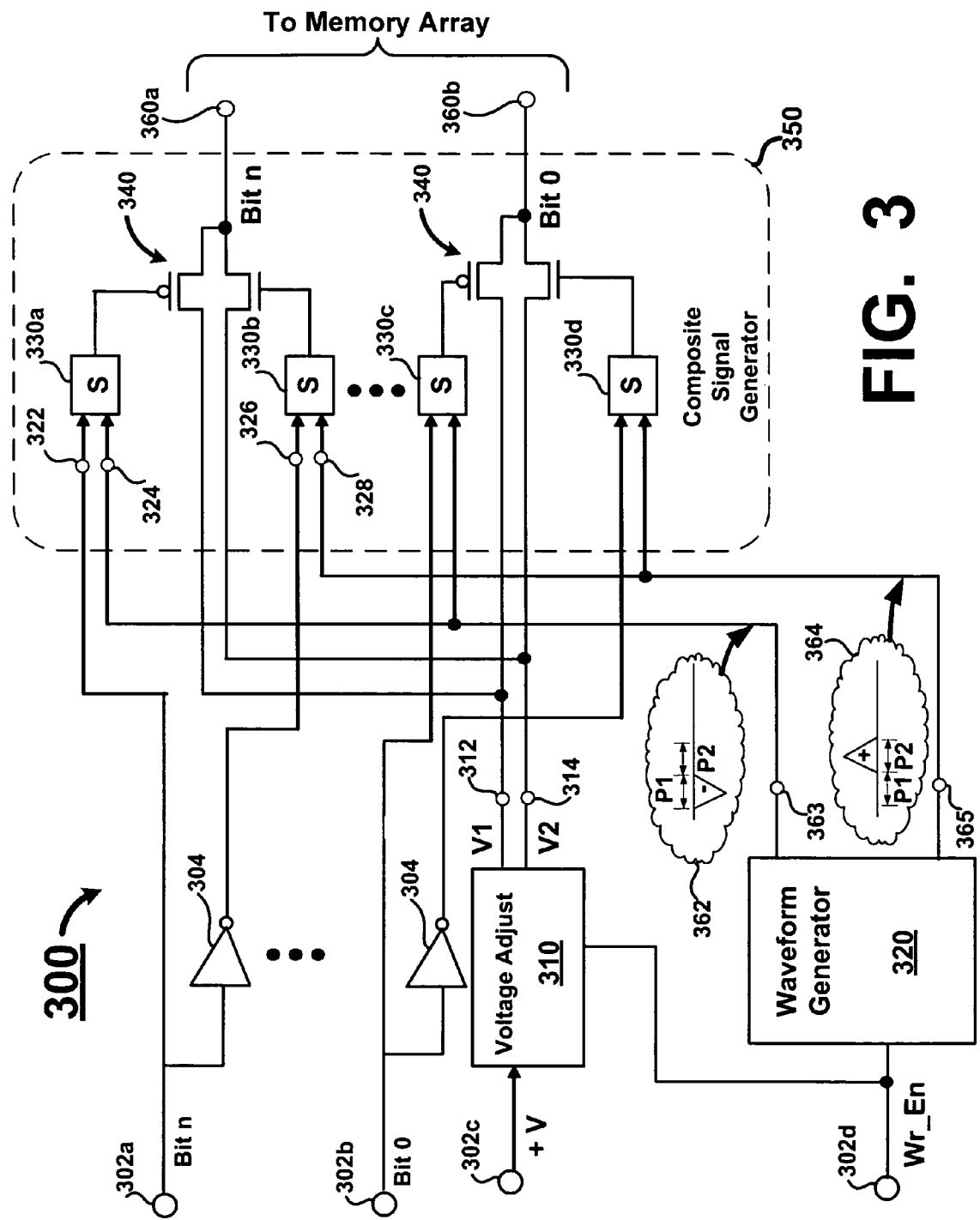

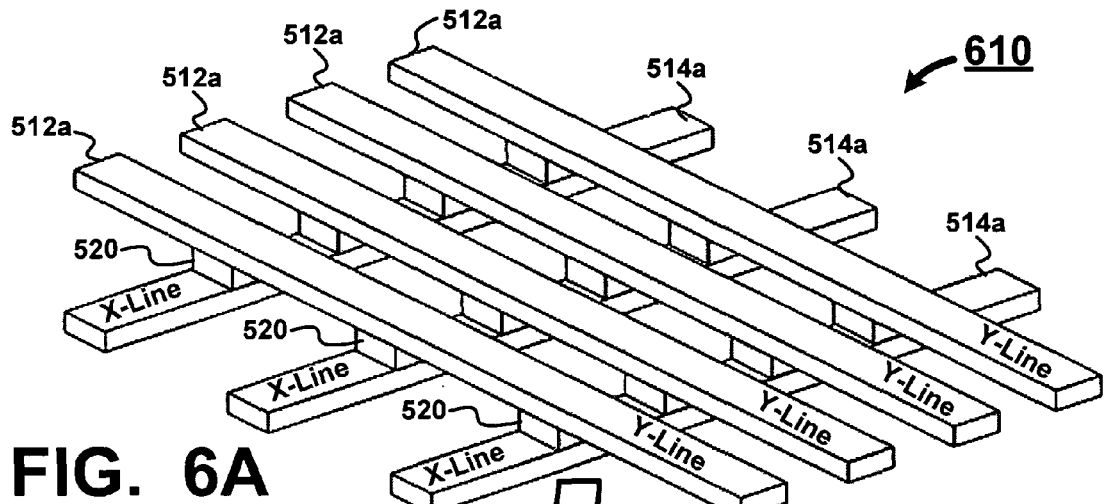
FIG. 6A
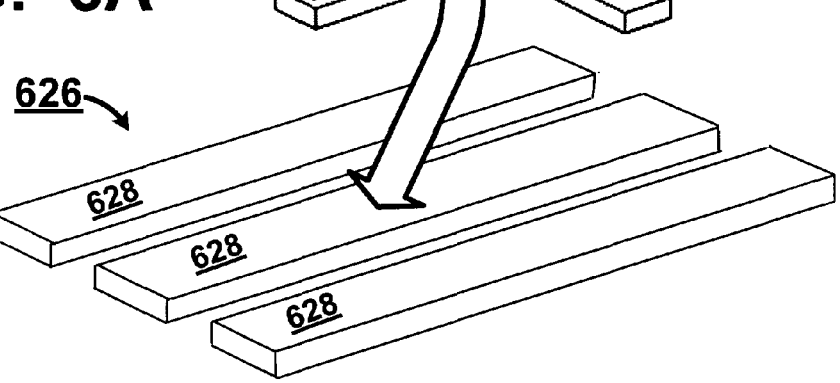
FIG. 6B
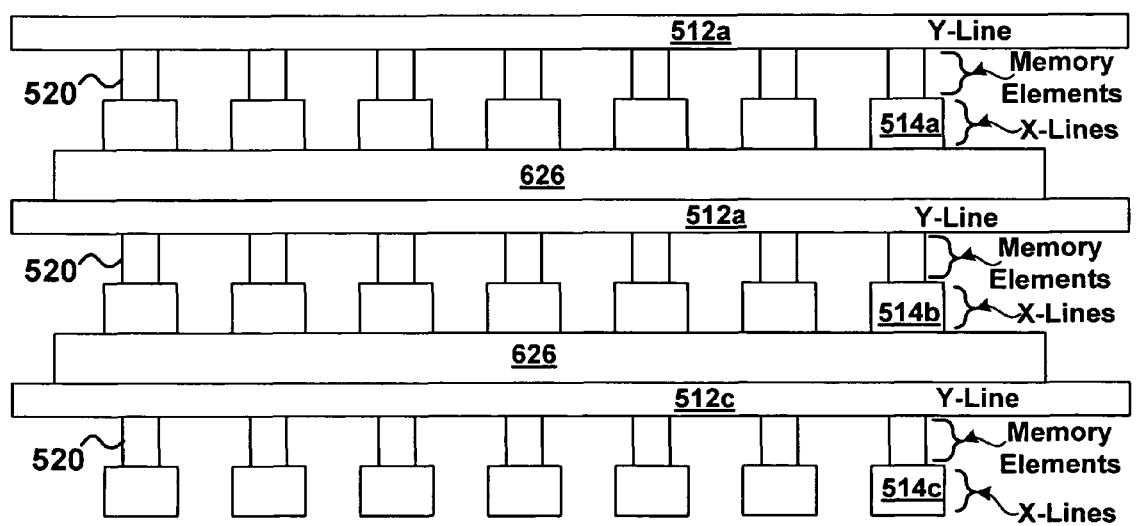

US 8,111,572 B2

DISTURB CONTROL CIRCUITS AND METHODS TO CONTROL MEMORY DISTURBS AMONG MULTIPLE LAYERS OF MEMORY

CROSS-REFERENCE TO RELATED APPLICATIONS

This application incorporates by reference the following related application: U.S. patent application Ser. No. 11/095,026, filed Mar. 30, 2005, and titled "Memory Using Mixed Valence Conductive Oxides," which has published as U.S. Pub. No. 20060171200.

FIELD OF THE INVENTION

Embodiments of the invention relate generally to data storage and computer memory, and more particularly, to systems, integrated circuits and methods for controlling memory disturbs to and among multiple layers of memory that include, for example, third dimensional memory technology.

BACKGROUND OF THE INVENTION

Various semiconductor memory technologies are susceptible to disturbances in data stored in memory cells. Once such disturbance is commonly referred to as a "memory disturb." A memory disturb typically occurs when a stimulus inadvertently alters a logical state of a data bit, thereby corrupting the data. Examples of stimuli include electrical voltages and currents and related phenomena (e.g., hot-carrier injection, etc.), as well as electro-magnetic radiation. A memory disturb, for example, might occur when applying a programming voltage to a conductor associated with both a selected memory cell that will be programmed, and unselected memory cells that are not intended to be programmed. Generally, unselected memory cells are either coupled to, or located adjacent to, the same bit lines and/or words lines as the selected memory. Memory disturbs, therefore, can reduce the ability of a memory, including non-volatile memory, to retain data.

Conventional Flash memory technology is a common type of memory technology that is susceptible to memory disturbs. A typical Flash memory cell structure includes a gate, a source, and a drain, and the usual mechanisms by which it stores data include Fowler-Norheim tunneling and hot electron injection. Flash memory generally experiences memory disturbs when bit line voltages partially activate, or turn on, one or more select transistors either in adjacent bit lines, or in a word line of unselected words, thereby altering the threshold voltage. Memory disturbs can occur in Flash memory cells during programming or erasing cycles when relatively high voltages, usually of singular magnitude and/or polarity, such as +12 volts, are applied.

Various approaches have been implemented to ameliorate the memory disturbs in Flash memory. For example, the rate at which a singled-valued programming voltage is applied to Flash memory arrays have be reduced. While this and other traditional approaches to reduce memory disturbs in conventional memory are functional, they have their drawbacks. For instance, typical disturb reduction measures are limited to a single layer of memory. And these typical disturb reduction measures are designed to accommodate memory cells having a gate, a source, and a drain structure, which are not well-suited to accommodate different memory technologies.

It would be desirable to provide improved techniques, systems and devices that minimize one or more of the drawbacks associated with conventional techniques for protecting data stored in memory.

BRIEF DESCRIPTION OF THE FIGURES

The invention and its various embodiments are more fully appreciated in connection with the following detailed description taken in conjunction with the accompanying drawings, in which:

FIG. 3 is a block diagram of a representative disturb controller, according to various embodiments of the invention;

FIGS. 6A and 6B illustrate examples of a cross-point array structure including one or more insulators to control memory disturbs, according to at least one embodiment of the invention;

Figure 1:
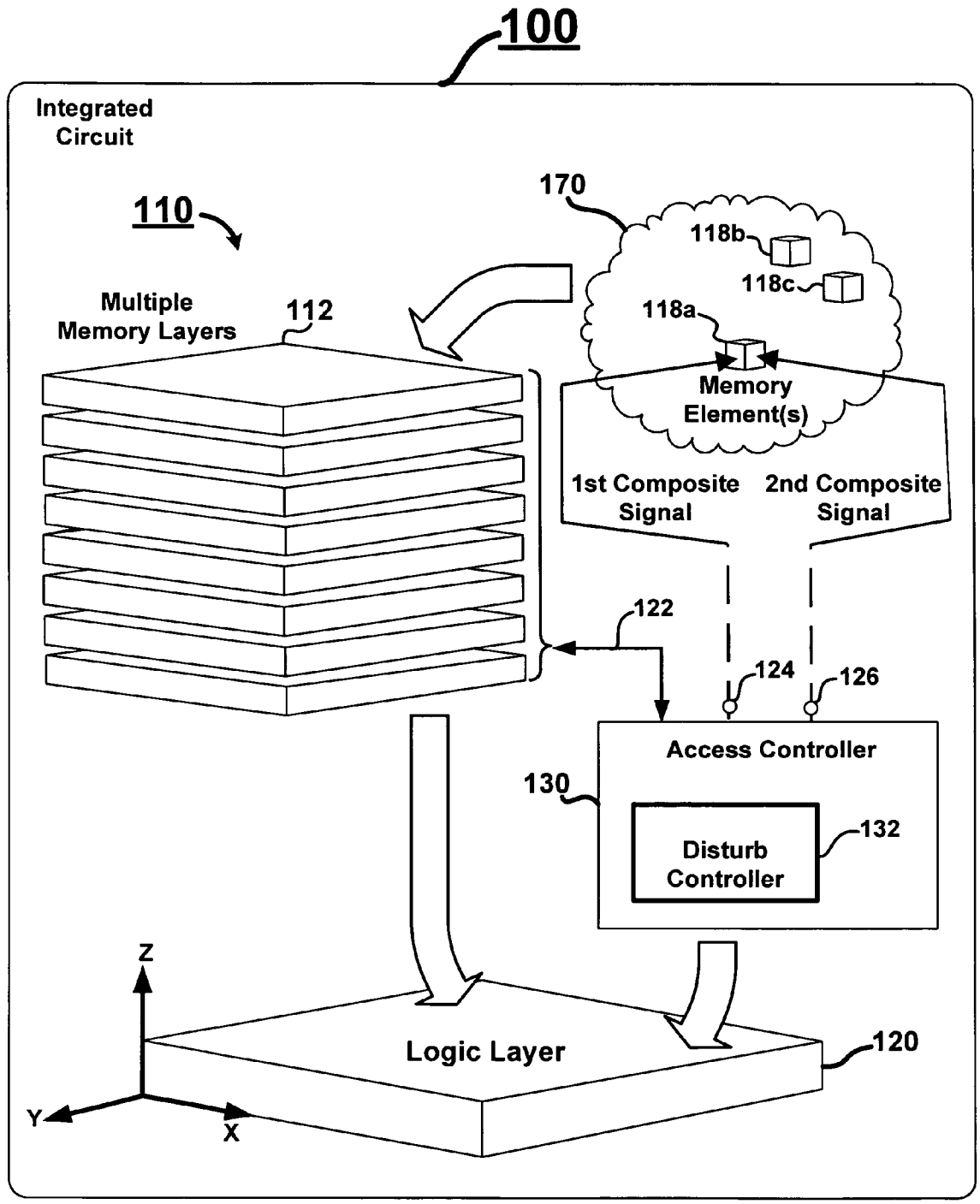
FIG. 1 illustrates an integrated circuit implementing a disturb controller configured to control memory disturbs in association with memory cells that constitute multiple memory layers, according to at least one embodiment of the invention.

Like reference numerals refer to corresponding parts throughout the several views of the drawings. Note that most of the reference numerals include one or two left-most digits that generally identify the figure that first introduces that reference number. Although the Drawings depict various examples of the invention, the invention is not limited by the depicted examples. Furthermore, the depictions are not necessarily to scale.

DETAILED DESCRIPTION

FIG. 1 illustrates an integrated circuit implementing a disturb controller configured to control memory disturbs in association with memory cells that constitute multiple memory layers, according to at least one embodiment of the invention. Integrated circuit 100 includes an access controller 130, a disturb controller 132, a memory 110 including multiple memory layers 112 formed on top of each other (e.g., in the Z dimension), memory elements (or cells) 170, such as memory elements 118a to 118c, which are disposed in multiple memory layers 112, and a logic layer 120. Integrated circuit 100 is configured to protect the contents of memory 110 that otherwise might be susceptible to memory disturbs. In particular, disturb controller 132 can control operation of access controller 130 to generate one or more composite signals that can reduce the affects of various stimuli on data stored in memory 110, thereby reducing memory disturbs. In one embodiment, the one or more composite signals can be configured to reduce the capacitive (or current) coupling among conductors coupled to, or adjacent to, both selected memory elements, such as memory element 118a, and unselected memory elements 118b and 118c. Thus, disturb controller 132 can facilitate—in whole or in part—in the prevention of inadvertent changes in logical states of stored data in memory elements 118b and 118c that might otherwise occur, such as when accessing memory element 118a to perform a write and/or read operation.

In view of the foregoing, an integrated circuit designer can add disturb controller 132 to integrated circuit 100 to control memory disturbs among memory elements that are disposed in two or more vertically-stacked layers of multiple layers 112. Adding disturb controller 132 enables the integrated circuit designer to control memory disturbs that can occur due to coupling between conductors and memory cells in the Z dimension of integrated circuit 100, as well as in the X and Y dimensions. In one embodiment, disturb controller 132 can cause generation of a first ("$1^{st}$") composite signal at terminal 124 and a second ("$2^{nd}$") composite signal at terminal 126—as access control signals—for application to memory element 118a during an access operation, such as a write operation. The first composite signal and/or the second composite signal can include shaped portions that can be associated with a slew rate. As such, disturb controller 132 can shape the waveforms of the first and second composite signals to control the rate of change in voltage (or current), which, in turn, can reduce memory disturbs. In at least one embodiment, disturb controller 132 can be configured to generate a composite signal as a write signal that has a number of write voltage values. In alternate embodiments, disturb controller 132 can be configured to generate one of the number of the write voltage values based on the magnitude of a logical value for a data bit to be written into memory 110. In at least one embodiment, disturb controller 132 is configured to interact via path 122 with a portion of one of multiple layers 112 (i.e., sub-arrays), which is not shown, to perform write and/or read operations in relation to a reduced number of memory cells. In at least one embodiment, disturb controller 132 is configured to retrieve via path 122 waveform control information from a portion of one of multiple layers 112, which is not shown, to shape a composite signal waveform in accordance with the waveform control information.

Access controller 130 is configured to convey at least data and addresses (not shown) for either writing to or reading from memory 110. As shown, access controller 130 can be formed as part of logic layer 120. In operation, access controller 130 can determine an access operation to be performed, such as a write operation or a read operation, and specify one or more memory elements (e.g., memory element 118a) to be accessed. In one embodiment, when access controller 130 implements a write operation, disturb controller 132 is configured to generate composite signals that includes at least one composite signal for driving X-lines of memory 110 and at least another composite signal for driving Y-lines. Disturb controller 132 can shape the waveforms of these composite signals to sufficiently reduce conditions that give rise to at least some memory disturbs, while maintaining performance levels (e.g., write or read speeds). To illustrate, consider that access controller 130 is performing a write operation to memory element 118a, and provides a data bit to disturb controller 132 for generating the first and second composite signals as write signals, which can be shaped or otherwise. In response to the logical state, disturb controller 132 can be configured to modify, for example, the voltage level (e.g., including polarity) of at least one of the first and second composite signals to effectuate the write operation for the particular logical state.

As used herein, a "composite signal" refers, at least in one embodiment, to either one or more write signals (or read signals) that are composed of distinct, multiple voltages for effectuating a write operation (or a read operation). In one embodiment, a composite signal can include two voltage magnitudes that have different polarities (e.g., a positive polarity, and a negative polarity). In a specific embodiment, a composite signal can include two voltage magnitudes, one of which is a maximum voltage (e.g., +7 volts, or +6 volts) during an access operation and the other being a minimum voltage (e.g., +1 volt, or 0 volts) during that same access operation. In various cases, the different polarities (or the maximum and minimum voltages) of a composite signal can be generated in either in series or in parallel. As used herein, a "shaped portion" of a waveform refers, at least in one embodiment, to the rate of change in a parameter used for writing or reading, such as the rate of change in a write voltage. The rate of change can be variable (e.g., to produce non-linearly shaped waveforms). In one embodiment, the shaped portion of a waveform can have a slew rate, which may be predetermined or programmable. As used herein, a "logic layer" refers, at least in one embodiment, to a layer of circuitry formed on a substrate, the circuitry including logic and gates for accessing memory elements formed in memory 110. The logic layer may include circuitry that serves other functions not associated with accessing the memory elements in memory 110. As used herein, a "plane" refers, at least in one embodiment, to a flat, conceptual surface passing containing, for example, the X and Y axes, the Y and Z axes, or the Z and X axes, as well as any similar surface that is parallel to any of the aforementioned axes. As such, a memory plane can include a planar arrangement of memory cells (or memory elements).

As used herein, a "memory element" refers, at least in one embodiment, to a memory cell (or a portion thereof) that is configured to store at least one data bit (or multiple multi-level states). In one embodiment, the memory element is a memory plug. In one embodiment, the memory element is a memory plug. In at least one embodiment, a memory element can be a third dimensional memory cell, each of which excludes a floating gate. In one embodiment, memory 110 can include non-volatile memory cells each of includes a two-terminal memory element that changes conductivity as a function of a voltage differential between a first terminal and a second terminal. In some cases, the memory element can be formed with an electrolytic tunnel barrier and a mixed valence conductive oxide. In some embodiments, memory elements 170 in memory 110 can be produced with equivalent fabrication processes that produce logic layer 120. As such, both can be manufactured in the same or different fabrication plants, or "fabs," to form integrated circuit 100 on a single substrate. This enables a manufacturer to first fabricate logic layer 120 using, for example, a CMOS process in a first fab, and then port logic layer 120 to a second fab, at which additional CMOS processing can be used to fabricate multiple memory layers 112 directly on top of logic layer 120. Inter-layer electrical structures that are well understood in the microelectronics art (e.g., vias, plugs, damascene contacts, and the like) can be used to electrically couple the multiple memory layers 112 with the circuitry in the logic layer 120.

In various embodiments, the functionality and/or the structure for disturb controller 132 can be incorporated into access controller 132, or can disposed external thereto. Further, the functionality and/or the structure for disturb controller 132 can be distributed within logic layer 120. For example, logic layer 120 can include at least a portion of disturb controller 132, with the multiple layers 112 of memory 110 being formed thereupon. In one embodiment, memory 110 can include a third dimension memory array comprising a cross-point array.

Figure 2:
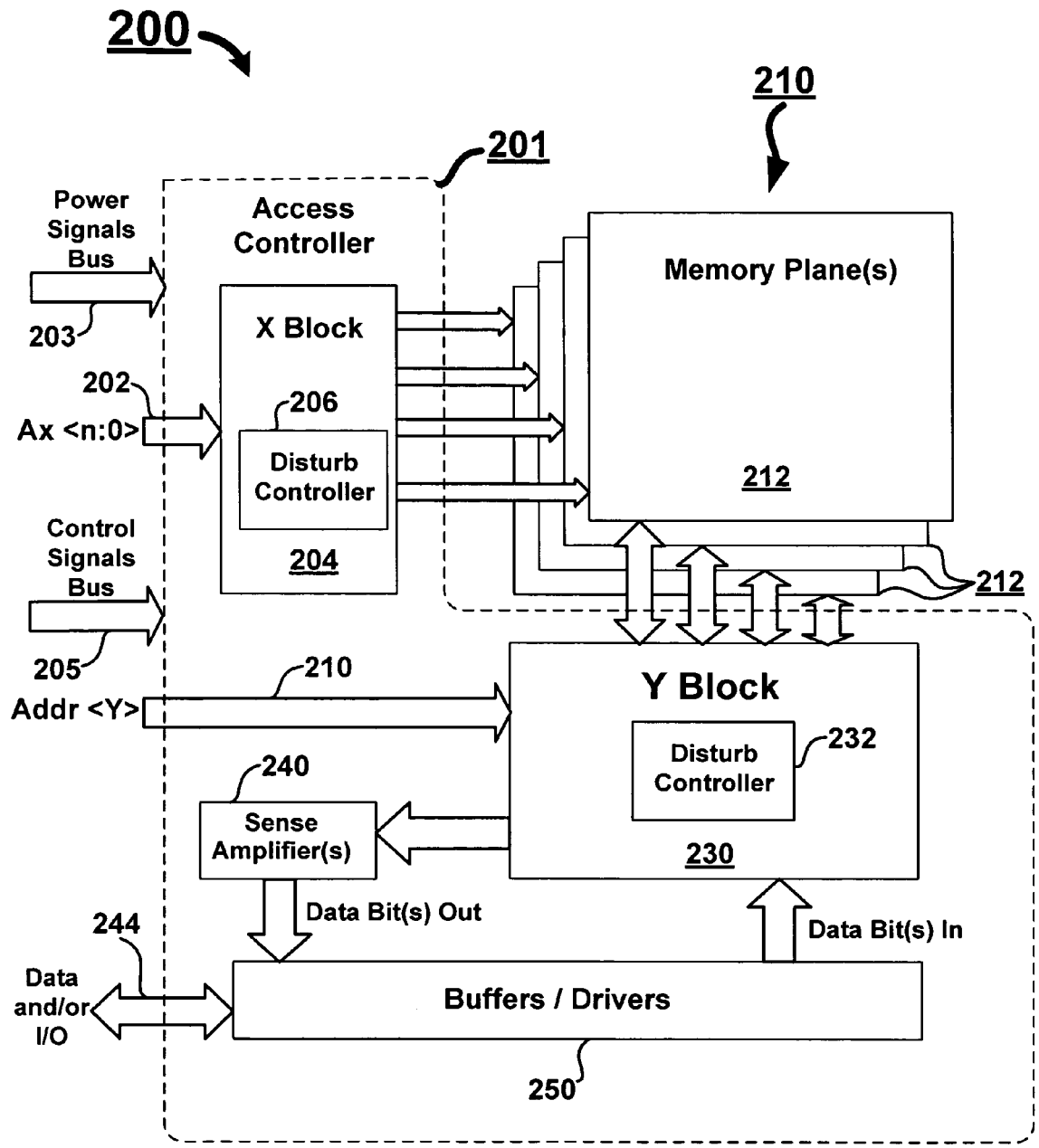
FIG. 2 is a block diagram of a representative access controller implementing one or more disturb controllers to reduce memory disturbs in association with one or more memory planes in a memory, according to various embodiments of the invention.

FIG. 2 is a block diagram 200 of a representative access controller implementing one or more disturb controllers to reduce memory disturbs in association with one or more memory planes 212 in memory 210, according to various embodiments of the invention. Access controller 201 is shown to include an X Block 204, a Y Block 230, one or more sense amplifiers 240, and a set of buffers and/or drivers ("Buffers/Drivers") 250. Note that while FIG. 2 shows X Block 204 and Y Block 230 including a disturb controller 206 and a disturb controller 230, respectively, the functionality and/or the structure of these disturb controllers can be disposed external to X Block 204 and Y Block 230, or can be distributed throughout access controller 201. Also note that the functionality and/or the structure of disturb controller 206 and disturb controller 230 can be combined.

Access controller 201 can be coupled to a control signals bus 205 to receive control signals, such as a write enable signal. Further, access controller 201 can be coupled to a power signals bus 203 to receive control signals, such as a write enable signal. Access controller 201 can be coupled to an address bus (not shown) to receive at least one subset of addresses ("(Ax<n:0>)") 202 of addresses destined for X Block 204 for selecting a horizontal array line (e.g., an "X Line"), and at least another subset of addresses ("(Addr<Y>)") 210 destined for Y Block 230 for applying specific access voltages on specific vertical lines (e.g., "Y Lines"). Data bus 244 is coupled to access controller 201 to exchange data with memory planes 212.

X Block 204 can include an address decoder (e.g., a pre-decoder and an X-decoder) for determining an X-Line with which to access. Y Block 230 also can include another address decoder (e.g., a predecoder and a Y-decoder) for determining a Y-Line. In operation, drivers in Buffers/Drivers 250 can generate write and read voltage signals to respectively write data into, and read data from, memory 210. In this case, disturb controller 230 can be configured to shape the write voltage signals of composite signals to, for example, write data into memory 210 while reducing memory disturbs among memory layers 212.

FIG. 3 is a block diagram of a representative disturb controller, according to various embodiments of the invention. Disturb controller 300 is shown to include inverter gates 304, a voltage adjust circuit 310, a waveform generator 320 and a composite signal generator 350. In the example shown, composite signal generator 350 includes high voltage switch gates ("S") 330a to 330d (e.g., high voltage AND gates), and transmission gates 340. Disturb controller 300 includes data bit terminals 302a and 302b to select specific X-lines associated with terminals 360a and 360b, respectively, to access a memory array (not shown). As shown, terminal 302b is associated with a first bit ("bit 0"), whereas terminal 302a is associated with an $n^{th}$ bit ("bit n"). Further, disturb controller 300 includes voltage terminal ("+V") 302c that can be configured to receive an externally-applied voltage, such as 3.3 to 5 volts, for use by voltage adjust circuit 310. In addition, disturb controller 300 can include a write enable terminal ("Wr_en") 302d for enabling write operations to the multiple layers of memory.

Voltage adjust circuit 310 is configured to provide voltages for either reading or writing to a memory array. In one embodiment, voltage adjust circuit 310 includes charge pump circuitry to boost a voltage or to generate negative voltages from an input voltage, such as from a positive input voltage at terminal 302c. Further, voltage adjust circuit 310 can include a regulator, and/or a switch to switch between voltage magnitudes (e.g., to switch between read voltage and write voltage magnitudes). In at least one embodiment, voltage adjust circuit 310 can be configured to generate one or more read signals (e.g., of different polarities) and one or more write signals (e.g., of different polarities). When the write enable signal is low at write enable terminal 302d, then the memory is in read mode. In this case, voltage adjust circuit 310 can generate a read voltage that can be applied to, for example, one or more X-lines. For example, voltage adjust circuit 310 can generate either a negative read voltage at terminal 312 as voltage V1, or a positive read voltage at terminal 314 as voltage V2. In another example, voltage adjust circuit 310 can generate both negative and positive read voltages concurrently for purposes of performing a read operation. But when the write enable signal is high at write enable terminal 302d, then the memory is in write mode. In this cases, voltage adjust circuit 310 can generate a negative write voltage at terminal 312 as voltage V1, as well as a positive write voltage at terminal 314 as voltage V2. As shown, voltage adjust circuit 310 provides the voltages V1 and V2 to transmission gates 340 for propagation into the memory array.

According to various embodiments, waveform generator 320 is configured to generate waveform shapes tuned to reduce memory disturbs. To illustrate the operation of disturb controller 300, consider that it can be configured for use in driving Y-lines. As such, waveform generator 320 can be configured to generate a negative ramp voltage signal at a specific rate at terminal 363, and a positive ramp voltage at the same or different rate at terminal 365. As illustrated in FIG. 3, negative ramp voltage signal 362 includes a negatively ramped signal in a first phase, P1, and has no voltage during a second phase, P2. Waveform generator 320 can generate positive ramp voltage signal 364 in a similar manner, except positive ramp voltage signal 364 has no voltage during the first phase, P1, whereas it has a positive ramp voltage signal during the second phase, P2.

Consider next, that a logical state of "1" is applied to at terminal for writing "bit n" into the memory array, whereby the write operation spans at least two phases (e.g., phase P1 and P2). Further to this example, waveform generator 320 respectively applies negative ramp voltage signal 362 and positive ramp voltage signal 364 to input terminals 324 and 328. Inverter 304 generates a zero value and applies it to terminal 326, thereby disabling positive ramp voltage signal 364 from shaping a positive write voltage at terminal 314. As such, the logical one applied to terminal 322 enables the switch 330a to pass negative ramp voltage signal 362 through to transmission gate 340, which, in turn, transmits a shaped write signal (e.g., as a composite write signal, or a portion thereof) via terminal 360a out to the memory array. Thus, a negative write voltage will be applied to a memory element to write a logical one, according to at least one embodiment. In a similar manner, when a logical "0" is to be written as bit n, positive ramp voltage signal 364 will be used in phase 2, P2, to write a zero via terminal 360a into the memory element. Note that while the above-described example relates to an implementation to drive Y-lines, disturb controller 300 can readily be adapted to generate X-Line signals for writing, as well as to generate either X or Y-Line signals for reading. Note further that the value of the composite signal, which in the above example was a write signal, is a function of the value of the logical state to be written into a specific memory element.

Figure 4A:
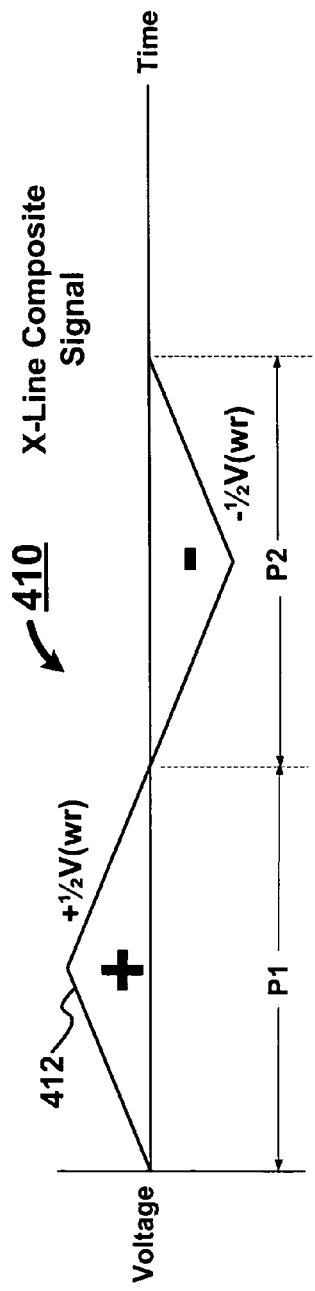
FIGS. 4A to 4D illustrate examples of composite signals generated by various disturb controllers, according to various embodiments of the invention.
Figure 4B:
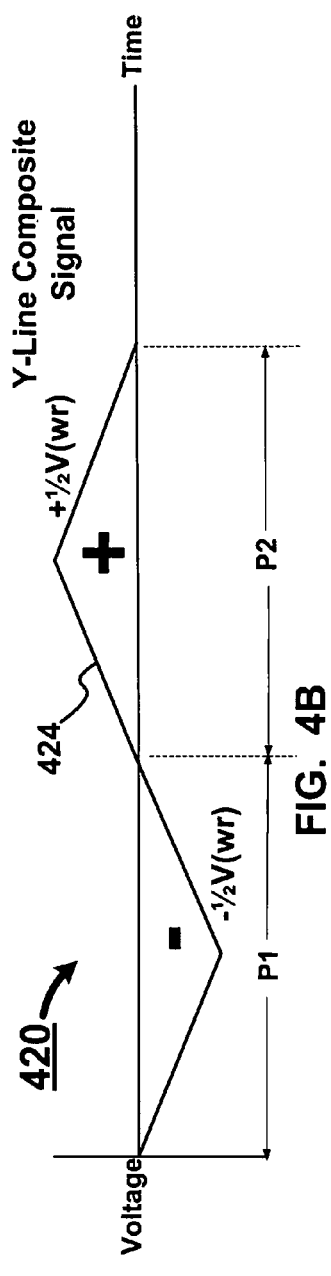

FIGS. 4A to 4D illustrate examples of composite signals generated by various disturb controllers, according to various embodiments of the invention. In particular, disturb controller 300 of FIG. 3 can generate either an X-line composite signal 410, as shown in FIG. 4A, or a Y-line composite signal 420, as shown in FIG. 4B. FIG. 4A shows that a disturb controller can generate a shaped waveform 412 so that X-line composite signal 410 can include a first voltage (e.g., +½V (wr)) during a first phase and a second voltage (e.g., −½V (wr)) during a second phase. In the examples shown, V(wr) represents a write voltage. FIG. 4B shows that the same or a different disturb controller can generate a shaped waveform 424 so that Y-line composite signal 420 can include a first voltage (e.g., −½V(wr)) during a first phase and a second voltage (e.g., +½V(wr)) during a second phase. A disturb controller can be programmed to generate the shaped waveforms 412 and 424 at one or more slew rates. Note that the slew rates for X-line composite signal 410 and Y-line composite signal 420 can be predetermined or can be programmable. In some examples, the slew rate with respect to FIGS. 4A and 4B can be described as the rate at which either X-line composite signal 410 or Y-line composite signal 420 transition from +½V(wr) to −½V(wr), or from −½V(wr) to +½V (wr).

Figure 4C:
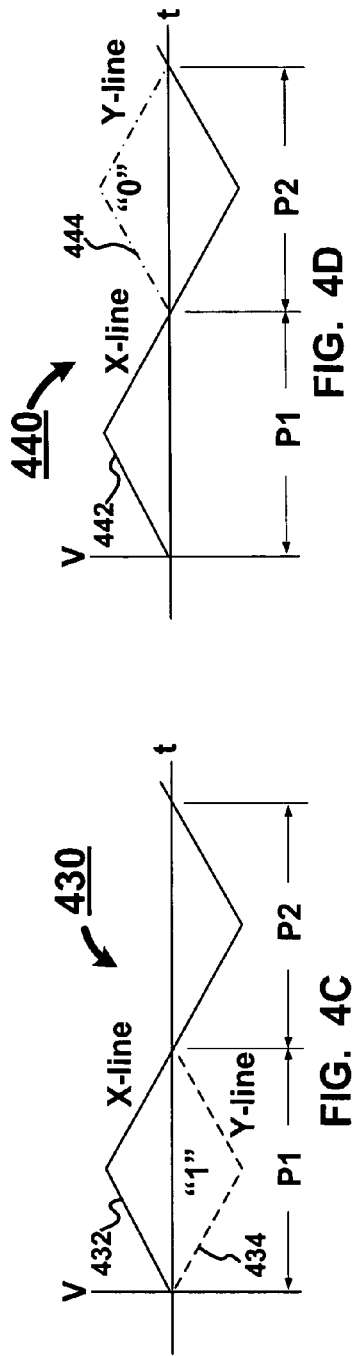
Figure 4D:
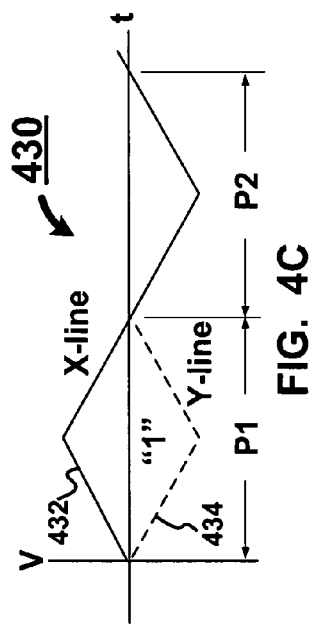

FIG. 4C shows the activation of at least a portion of a Y-line composite signal 434 during positive values of an X-line composite signal 432 to write a "1" into a memory element during phase 1 (e.g., P1). Likewise, FIG. 4D shows the activation of at least a portion of a Y-line composite signal 444 during negative values of an X-line composite signal 442 to write a "0" into a memory element during phase 2 (e.g., P2). While FIGS. 4A to 4D are shown as triangular waveforms, the shaped waveforms for composite signal can be of any shape, such as a sinusoid, according to various embodiments. Note, too, that while X-line composite signal 410 and Y-line composite signal 420 range from about +½V(wr) to −½V(wr), these composites each can vary from any portion (or fraction/percentage) of +V(wr) to any portion (or fraction/percentage) of −V(wr). For example, the composite signals of FIGS. 4A and 4B can range from 0 V to V(wr), or from 0V to −V(wr). In another example, V(rd), which represents a read voltage, can be substituted for V(wr). Furthermore, a polarity of the read voltage V(rd) can be positive or negative. Typically, a magnitude of the read voltage V(rd) is less than a magnitude of the write voltage V(wr).

Figure 5A:
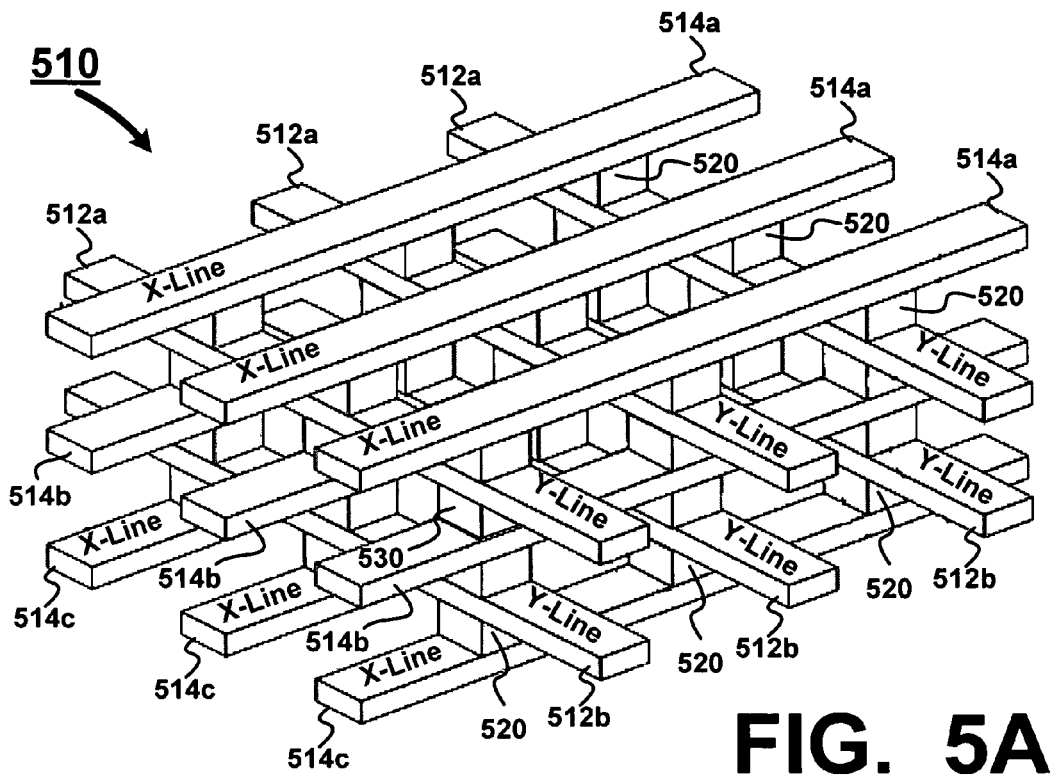
FIGS. 5A and 5B illustrate examples of a stacked crosspoint array structure for which a disturb controller generates composites signals, according to at least one embodiment of the invention.
Figure 5B:
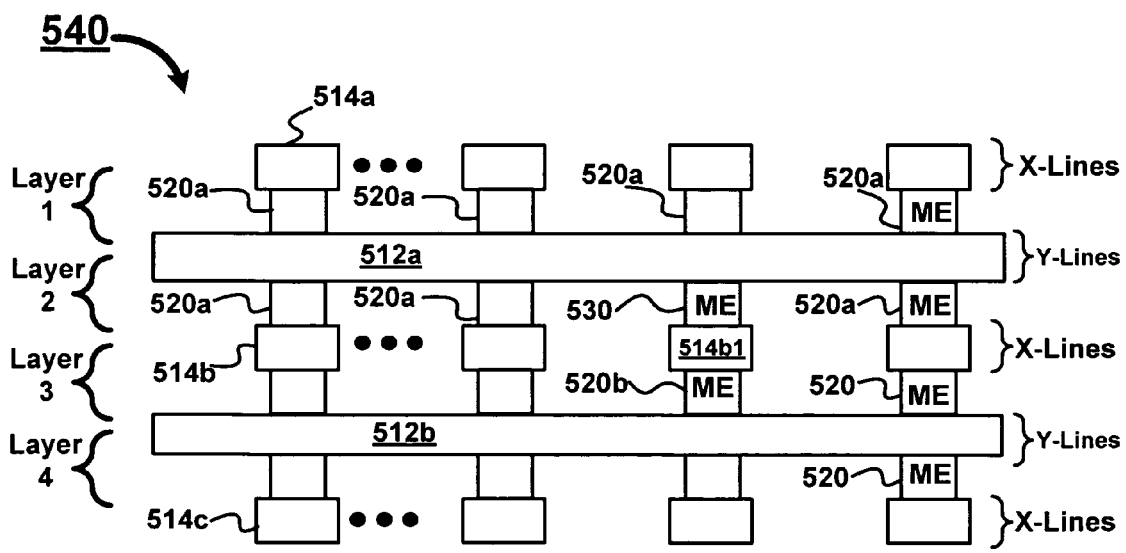

FIGS. 5A and 5B illustrate examples of a stacked cross-point array structure for which a disturb controller generates composites signals, according to at least one embodiment of the invention. FIG. 5A depicts an example of a stacked cross-point array 510 employing four layers of memory, as shown in FIG. 5B, which depicts a side view 540 of stacked cross-point array 510. Memory elements 520 are formed between alternating layers of X-Lines (e.g., X-Lines 514a, 514b and 514c) and Y-Lines (e.g., Y-Lines 512a and 512b), such that each memory element 520 is associated with a X-Line 514 and a Y-Line 512. To illustrate the implementation of composite signals, consider that a disturb controller (not shown) is configured to apply an X-line composite signal and a Y-line composite signal to memory element 520 so as to reduce memory disturbs in association with adjacent memory elements. As shown in FIG. 5B, a Y-line composite signal is applied to Y-Line 512a and an X-Line composite signal is applied to X-Line 514b1 to program a datum (or data, if multi-level) in memory element 530, which in this case can be susceptible to memory disturbs between vertically-stacked layers. A shaped waveform for the Y-line composite signal, as applied to Y-Line 512a, can facilitate a reduction in memory disturbs associated with memory elements 520a, which are unselected but are nevertheless exposed to the Y-line composite signal. A shaped waveform for the X-line composite signal, as applied to X-Line 514b1, can facilitate a reduction in memory disturbs associated with memory elements 520b, which is also an unselected memory element but nevertheless is exposed to the X-line composite signal.

FIGS. 6A and 6B illustrate examples of a cross-point array structure including one or more insulators to control memory disturbs, according to at least one embodiment of the invention. FIG. 6A is a perspective view showing an example of a cross-point array 610 including a single layer of memory elements 520. X-lines 514a are arranged orthogonal to Y-Lines 512a, and memory elements 520 are located at the intersections of X-lines 514a and Y-Lines 512a. Here, Y-Lines 512a accompany X-lines 514a to form a first set of X-Y line pairs, which are formed in association with an insulator 626 disposed between the first set of X-Y line pair and a second set of X-Y line pairs (not shown). A modified cross-point arrangement is formed when X-lines 514a and Y-Lines 512a are formed upon an insulator 626, which reduces memory disturbs with the second set of X-Y line pairs (not shown). Note that while FIG. 6A shows that insulator 626 can be composed of insulator portions 628 that are formed under X-lines 514a, FIG. 6B depicts insulator 626 as a unitary, or monolithic entity. FIG. 6B is a side view 640 of two insulators 626 sandwiched between three X-Y Line pairs.

Figure 7:
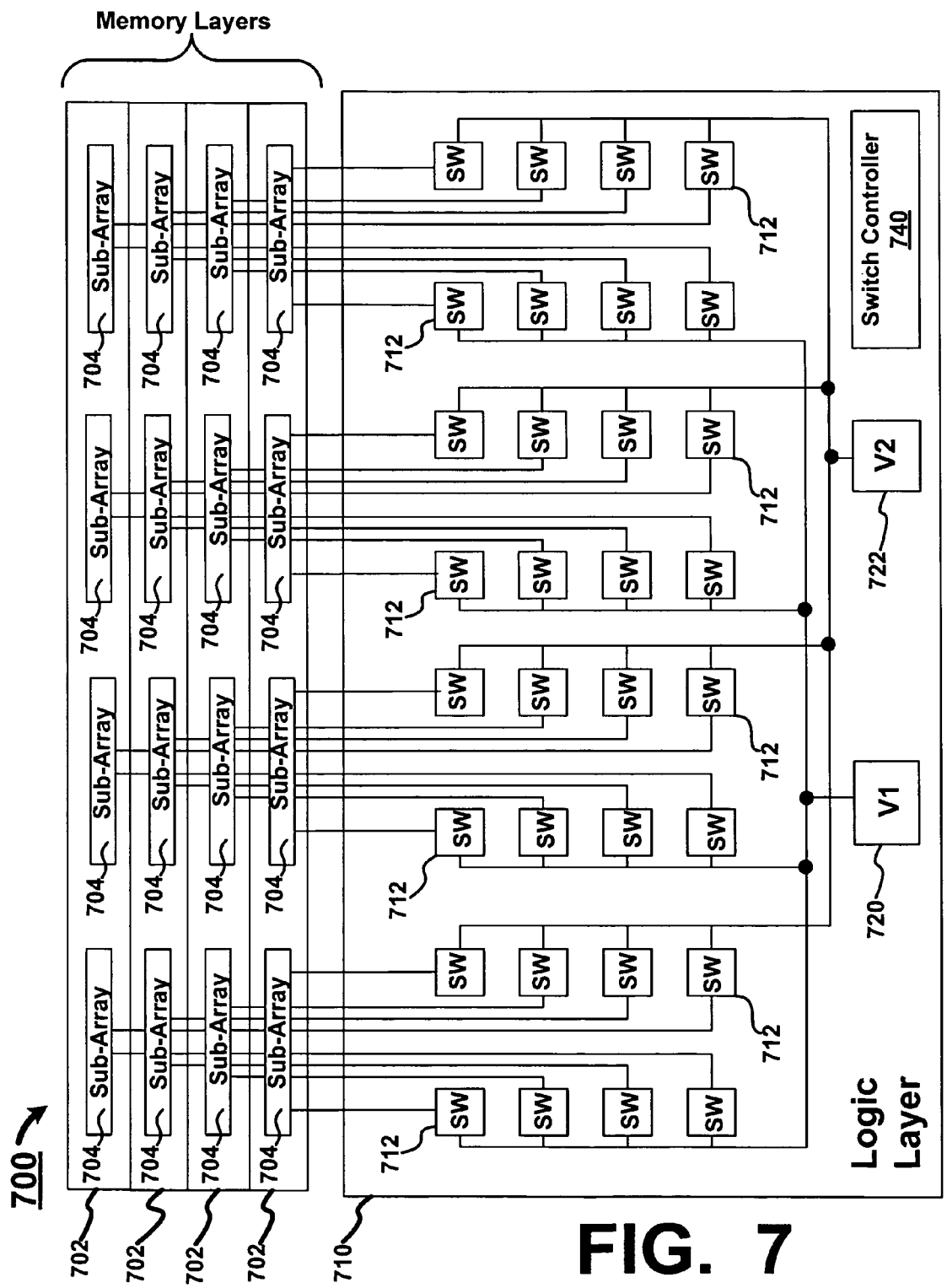
FIG. 7 is a diagram depicting an example of multiple layers of memory that are partitioned into sub-arrays to control memory disturbs, according to at least one embodiment of the invention.

FIG. 7 is a diagram depicting an example of multiple layers of memory that are partitioned into sub-arrays to control memory disturbs, according to at least one embodiment of the invention. Integrated circuit 700 includes a number of memory layers 702 formed upon a logic layer 710. As shown, one or more of memory layers 702 are partitioned into any number of sub-arrays 704. For example, by breaking layers 702 down to sub-arrays 704, the amount of memory elements (not shown) crossed by an active Y-Line (e.g., a bit line) and/or an active X-Line (e.g., a word line) is reduced. By reducing the number of unselected memory elements exposed to active X-lines and Y-lines, there are fewer opportunities for memory disturbs. As shown, logic layer 710 can include a number of switch circuits ("SW") 712, each of which are controlled by a switch controller 740. In operation, switch controller 740 routes via switches 712 a first voltage signal ("V1") 720, such as an X-line composite signal, and a second voltage signal ("V2") 722, such as a Y-line composite signal, to at least one of sub-arrays 704, thereby restricting the composite signals to at least the selected sub-array 704.

Figure 8:
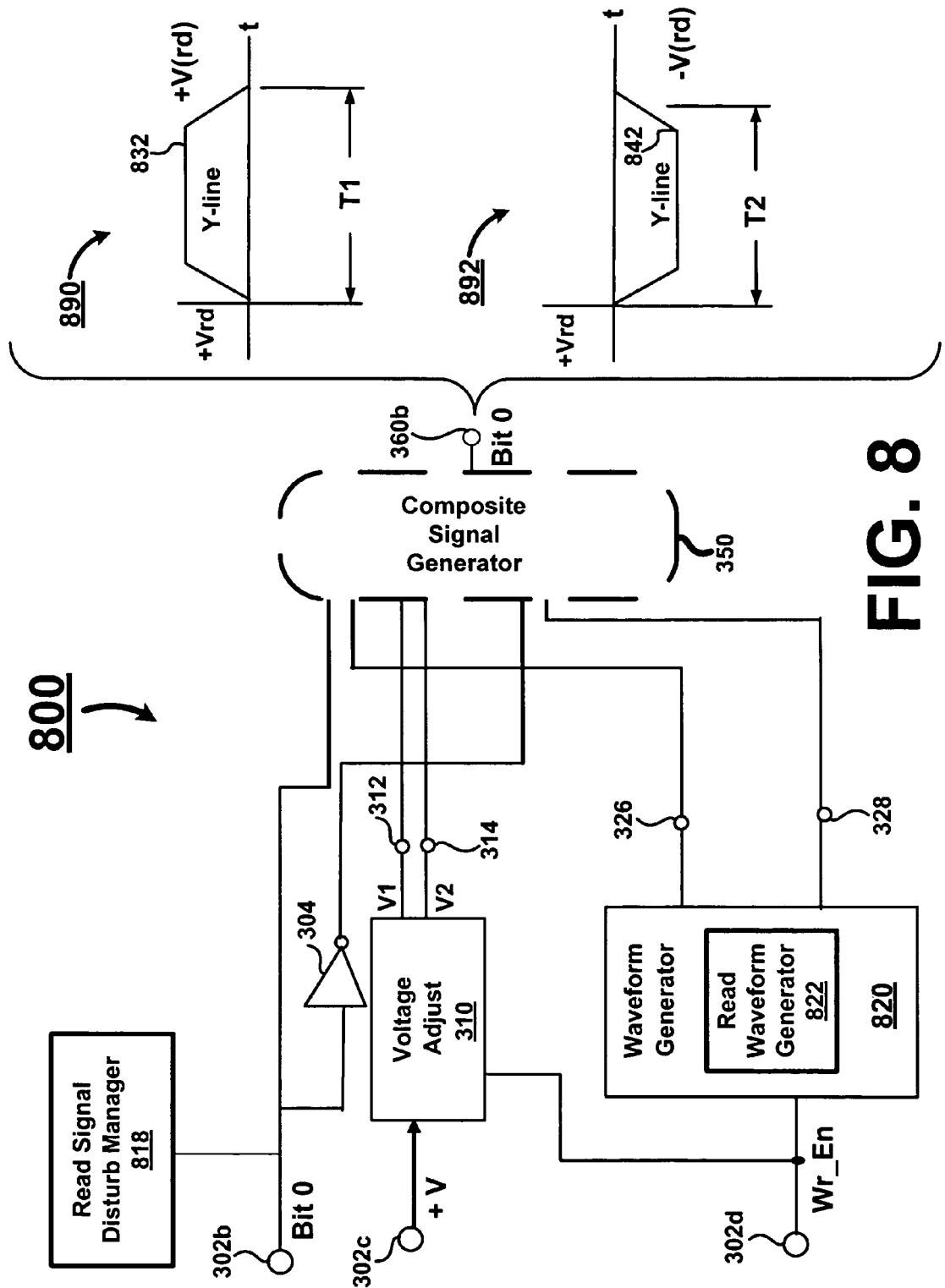
FIG. 8 is a block diagram of another representative disturb controller that is configured to at least modify read signals to reduce memory disturbs, according to at least one embodiment of the invention.

FIG. 8 is a block diagram of another representative disturb controller that is configured to at least modify read signals to reduce memory disturbs, according to at least one embodiment of the invention. Disturb controller 800 is shown to include inverter gates 304, a voltage adjust circuit 310, a read signal disturb manager 818, a waveform generator 820 and a composite signal generator 350. Note that similarly-numbered elements in FIGS. 3 and 8 can have equivalent functionalities and/or structures as those described in FIG. 3. For example, when a write enable signal ("Wr_En") is low at write enable terminal 302d, then the memory is in read mode. In this case, voltage adjust circuit 310 can generate a negative read voltage at terminal 312 as voltage V1 (e.g., −V(rd)), or a positive read voltage at terminal 314 as voltage V2 (e.g., +V(rd)). Either the negative read voltage or the positive read voltage can be applied to one terminal of a memory element, with the sensing being performed at another terminal of the memory element.

In cases in which the peak read voltage values are less than the peak write voltage values, waveform generator 820 can be configured to generate shaped waveforms that either have faster slew rates than the shaped waveforms for write signals, such as a composite write signal, or have negligible slew rates. As such, waveform generator 820 can generate shaped waveforms for read voltage signals that have steeper ramped portions than write voltage signals. In one embodiment, waveform generator 820 includes a read waveform generator 822 that can be configured to switch, in response to an inactive (i.e., low) write enable signal, from generating a first set of shaped waveforms for composite signals to apply to X-Lines and Y-Lines during a write operation, to generating a second set of shaped waveforms for read voltage signals for X-Lines and/or Y-Lines during a read operation. Examples of shaped waveforms for reading are shown as waveforms 832 and 842.

In the example shown, read signal disturb manager 818 can be configured to apply either a logical state of, for example, "1" or "0" to form either a read signal 890 or a read signal 892, whereby the polarities of the read voltages applied to, for example, the Y-Lines are different at different intervals of time. In one embodiment, read signal disturb manager 818 can be configured to generate alternating polarities for the read voltage signal. For example, during period T1, a read voltage of +V(rd) can be generated, whereas in period T2, a read voltage of −V(rd) can be generated. By applying read voltages of differing polarities, biasing of the material constituting the memory cells is reduced. Biasing of the material can contribute to memory disturbs, disturb controller 800 can reduce inadvertent data changes. In another embodiment, read signal disturb manager 818 can be configured to randomly generate different polarities for the read voltage signal. For example, randomly generated polarities can be based on a function of polynomial generation, the techniques of which are known.

Figure 9:
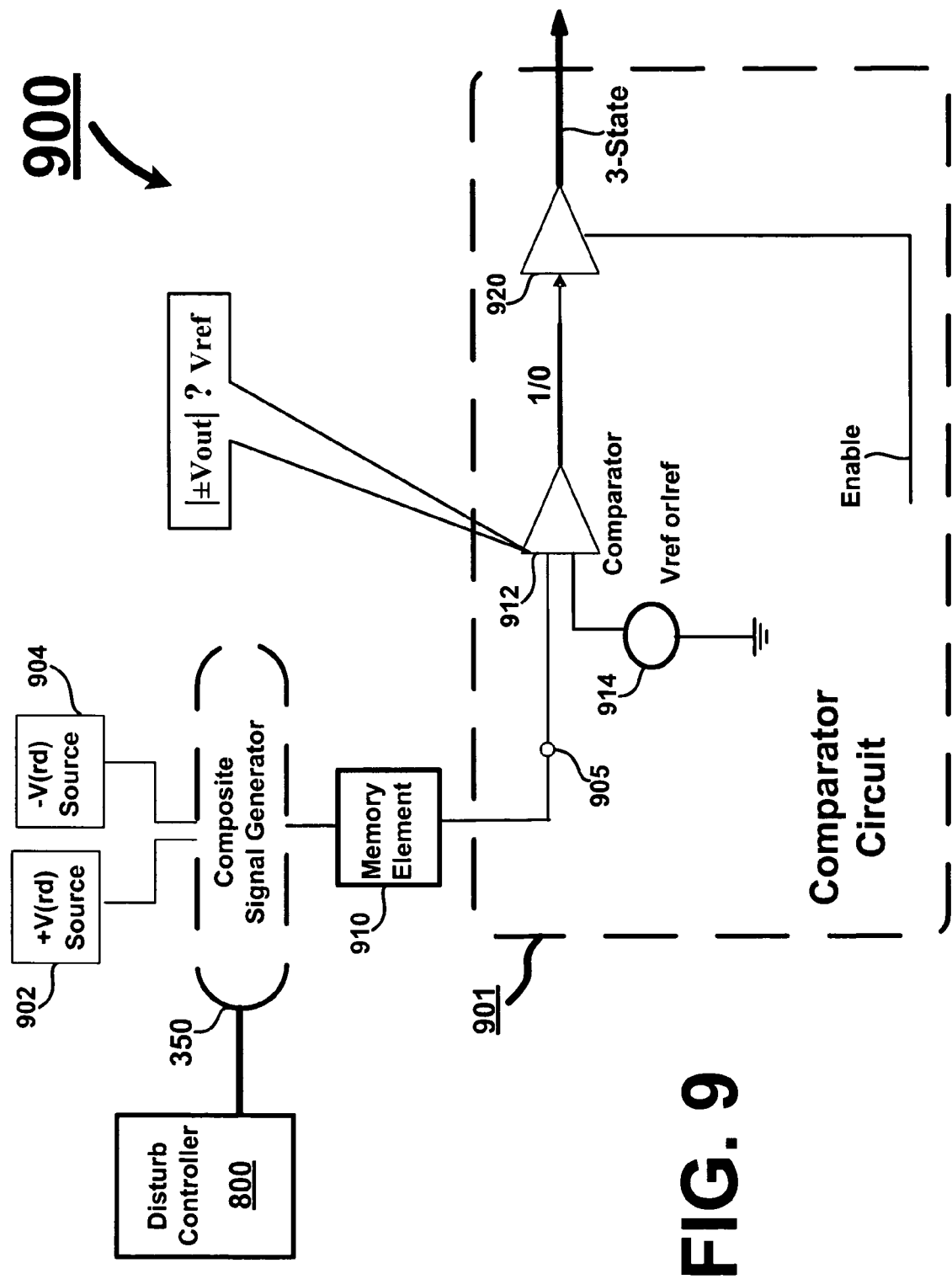
FIG. 9 is a block diagram of comparator circuit that is configured to sense the logical states of data read from a memory element, according to at least one embodiment of the invention.

FIG. 9 is a block diagram of comparator circuit that is configured to sense the logical states of data read from a memory element, according to at least one embodiment of the invention. In diagram 900, disturb controller 800 is shown to be coupled to composite signal generator 350 to apply either a positive read voltage from a positive read voltage ("+V(rd)") source 902, or a negative read voltage from a negative read voltage ("−V(rd)") source 904. When a positive read voltage and a negative read voltage are applied to memory element 910, a resistance value representative of a logical state can be provided to terminal 905. In particular, a positive read voltage can produce a positive output voltage ("Vout") and a negative read voltage can produce a negative output voltage. As such, the magnitude (or absolute value) of the output voltage, regardless of polarity, can be provided to comparator circuit 901, which includes a comparator 912 for comparing the magnitude of the output voltage at terminal 904 to a reference 914, such as a reference voltage ("Vref"), for example. Different ranges of magnitudes of the output voltage can represent different logical states. Comparator 912, therefore, is configured to determine the logical state regardless of the polarities of multiple read signals. Then, a tri-state gate 920 can be enabled by an Enable signal to output the read data (or datum).

Figure 10:
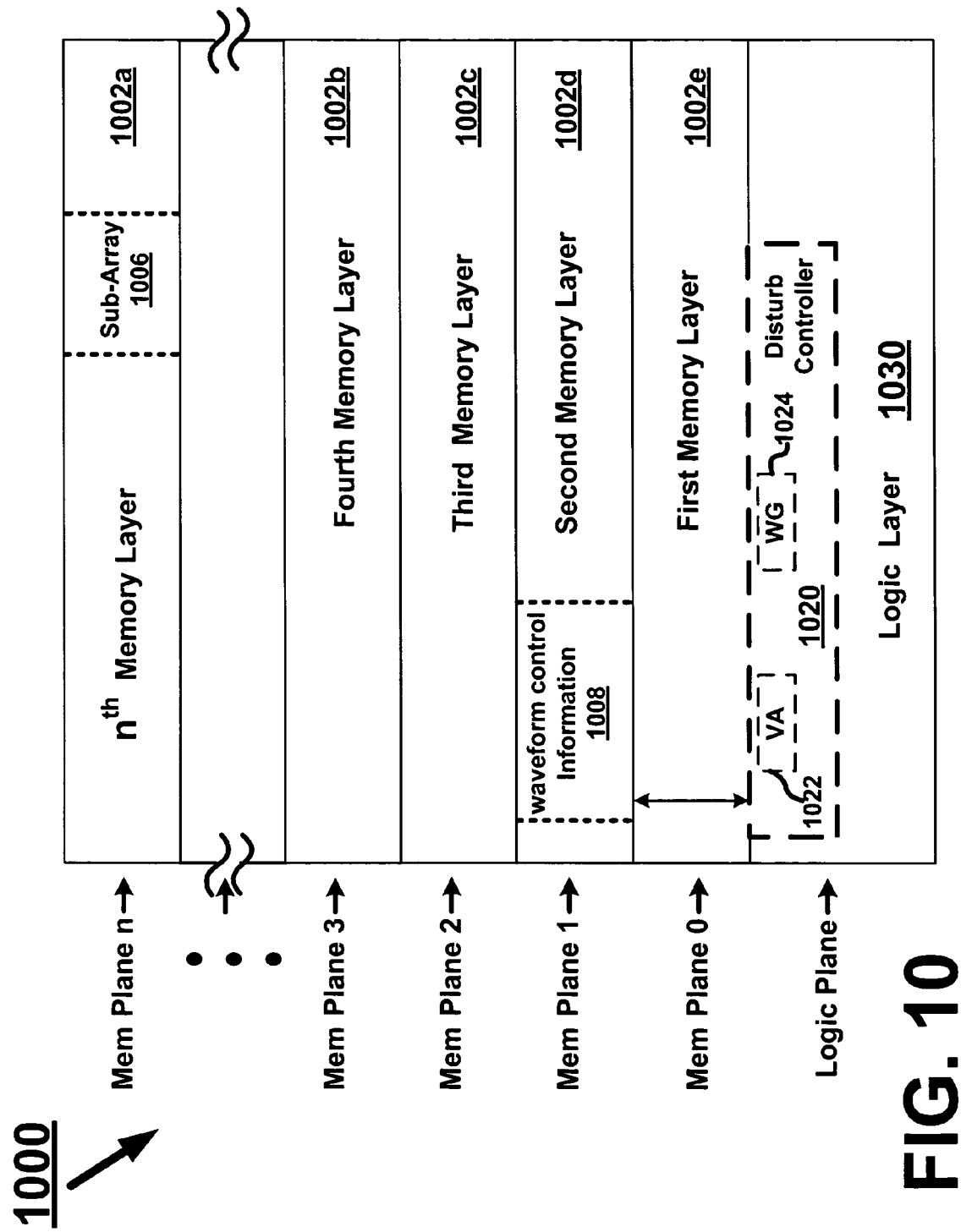
FIG. 10 depicts a cross-section view of an example of an integrated circuit including a disturb controller, according to one embodiment of the invention.

FIG. 10 depicts a cross-section view of an example of an integrated circuit including a disturb controller, according to one embodiment of the invention. Cross-section view 1000 shows multiple memory layers being vertically disposed above or on a logic layer 1030, which can include logic circuitry for implementing selection of memory cells as well as controlling access to those memory cells, and a semiconductor substrate upon which the logic circuitry can be formed. The logic circuitry, for example, can include a disturb controller 1020 having a voltage adjust circuit ("VA") 1022 and a waveform generator circuit ("WG") 1024. Multiple memory layers can include a first layer 1002e, a second layer 1002d, a third layer 1002c, a fourth layer 1002b, and an $n^{th}$ memory layer 1002a, each of which can include third dimension memory cells. As shown, waveform control information 1008 can be stored in memory elements of second layer 1002d, the waveform control information being used by waveform generator 1024 to generate a shaped waveform having a shaped defined by the waveform control information. For illustrative purposes, $n^{th}$ memory layer 1002a is shown to include a sub-array 1006. In other embodiments, the multiple memory layers shown in cross-section view 1000 can include more or fewer layers than as shown in FIG. 10. Note that in this example each of the multiple memory layers is oriented in the X and Y plane, each plane being designated by "Mem Plane." Logic layer 1030 is shown to lie in a base plane designated as "logic plane."

The various embodiments of the invention can be implemented in numerous ways, including as a system, a process, an apparatus, or a series of program instructions on a computer readable medium such as a computer readable storage medium or a computer network where the program instructions are sent over optical or electronic communication links. In general, the steps of disclosed processes may be performed in an arbitrary order, unless otherwise provided in the claims.

The foregoing description, for purposes of explanation, used specific nomenclature to provide a thorough understanding of the various embodiments of the invention. However, it will be apparent to one skilled in the art that specific details are not required in order to practice the various embodiments of the invention. In fact, this description should not be read to limit any feature or aspect of the various embodiments of the invention to any embodiment; rather features and aspects of one embodiment can readily be interchanged with other embodiments.

Thus, the foregoing descriptions of specific embodiments of the invention are presented for purposes of illustration and description. They are not intended to be exhaustive or to limit the invention to the precise forms disclosed; many alternatives, modifications, equivalents, and variations are possible in view of the above teachings. For the purpose of clarity, technical material that is known in the technical fields related to the embodiments has not been described in detail to avoid unnecessarily obscuring the description. Thus, the various embodiments can be modified within the scope and equivalents of the appended claims. Further, the embodiments were chosen and described in order to best explain the principles of the invention and its practical applications; they thereby enable others skilled in the art to best utilize the invention and various embodiments with various modifications as are suited to the particular use contemplated. Notably, not every benefit described herein need be realized by each embodiment of the present invention; rather any specific embodiment can provide one or more of the advantages discussed above. In the claims, elements and/or operations do not imply any particular order of operation, unless explicitly stated in the claims. It is intended that the following claims and their equivalents define the scope of the invention.

What is claimed is:

1. An integrated circuit comprising:
a memory including non-volatile memory cells disposed in-multiple layers of memory; and a disturb controller configured to regulate memory disturbs among two or more vertically stacked layers of the multiple layers of memory, the disturb controller configured to generate a plurality of composite signals to be applied to at least one cross-point memory array disposed in the multiple layers of memory, wherein the plurality of composite signals comprises a composite write signal, wherein the composite write signal comprises at least two signals that include shaped portions.

2. The integrated circuit of claim 1, wherein the disturb controller is further configured to generate the shaped portions at a slew rate.

3. The integrated circuit of claim 1, wherein the non-volatile memory cells comprise third dimension memory cells.

4. The integrated circuit of claim 1, wherein the disturb controller is further configured to generate a write signal having a plurality of write voltage values, and
wherein the disturb controller is configured to generate one of the plurality of the write voltage values based on the magnitude of a logical value.

5. The integrated circuit of claim 1 and further comprising:
a logic layer including at least a portion of the disturb controller, the multiple layers of memory being fabricated directly on top of the logic layer.

6. The integrated circuit of claim 5 and further comprising:
a semiconductor substrate upon which the logic layer is formed, the multiple layers of memory being fabricated directly on top of the logic layer using the same fabrication process used to form the logic layer on the semiconductor substrate.

7. The integrated circuit of claim 1, wherein each non-volatile memory cell comprises a two-terminal memory element that changes conductivity as a function of a voltage differential between a first terminal and a second terminal.

8. The integrated circuit of claim 1, wherein the multiple layers of memory include memory elements and each memory element includes an electrolytic tunnel barrier and a mixed valence conductive oxide.

9. The integrated circuit of claim 1, wherein the memory includes a third dimension memory array configured as a cross-point array.

10. A method for regulating disturbances of data stored in a memory comprising:
generating a composite write signal to write a data bit into a memory cell disposed in one of a plurality of multiple layers of memory that are fabricated directly on top a semiconductor substrate that includes a logic layer; and
shaping a portion of the composite write signal as a function of a logical value of the data bit using a disturb controller formed in the logic layer, the disturb controller configure to output a shaped potion of the composite write signal, wherein the composite write signal comprises at least two signals that include shaped portions.

11. The method of claim 10, wherein the shaping the portion of the write signal comprises forming a positive ramp voltage.

12. The method of claim 11, wherein the forming the positive ramp voltage comprises forming the positive ramp voltage during a first period of time.

13. The method of claim 10, wherein the shaping the portion of the write signal comprises forming a negative ramp voltage.

14. The method of claim 13, wherein forming the negative ramp voltage comprises forming the negative ramp voltage during a second period of time.

15. The method of claim 10, wherein the multiple layers of memory include third dimension non-volatile memory cells.

16. An integrated circuit comprising:
a logic layer formed on a semiconductor substrate; a third dimension memory connected with to the logic layer, the third dimension memory including a cross-point arrangement; and a disturb control circuit having at least a portion formed within the logic layer, the disturb controller configured to generate a plurality of composite signals to be applied to the third dimensional memory, wherein the plurality of composite signals comprises a composite write signal, wherein the composite write signal comprises at least two signals that include shaped portions.

17. The integrated circuit of claim 16 and further comprising: a voltage adjust circuit configured to generate one or more read signals and one or more write signals.

18. The integrated circuit of claim 16 and further comprising: a waveform generator circuit configured to shape one or more write signals differently than one or more read signals.

19. The integrated circuit of claim 18, wherein the waveform generator circuit is further configured to access a portion of the third dimension memory that is configured to store waveform control information that defines the shape of the one or more write signals.

20. The integrated circuit of claim 16, wherein the third dimensional memory further comprises a plurality of sub-arrays in the third dimensional memory, each of the sub-arrays being selectable in isolation from other sub-arrays.

21. The integrated circuit of claim 16 wherein the third dimension memory further comprises a modified cross-point arrangement in which a Y-line is accompanied by an X-line to form an X-Y Line pair.

22. The integrated circuit of claim 21 and further comprising: an insulator disposed between a first X-Y line pair and a second X-Y line pair.

23. The integrated circuit of claim 16, wherein the third dimension memory is fabricated directly on top of the logic layer.

* * * * *